United States Patent [19]

Jason

[11] 4,413,235

[45] Nov. 1, 1983

[54] LOW TEMPERATURE COEFFICIENT LOGARITHMIC ELECTRONIC GAIN CONTROLLED AMPLIFIER

[75] Inventor: Barry L. Jason, Bedford, Tex.

[73] Assignee: Motorola, Inc., Schaumburg, Ill.

[21] Appl. No.: 236,944

[22] Filed: Feb. 23, 1981

[51] Int. Cl.³ .......................... H03F 3/45; H03G 3/10
[52] U.S. Cl. .................................... 330/254; 330/289; 330/285
[58] Field of Search ............... 330/256, 289, 254, 285; 307/310; 328/3

[56] References Cited

U.S. PATENT DOCUMENTS

| | | | |
|---|---|---|---|
| 3,105,942 | 10/1963 | Hermes | 330/143 |
| 3,188,576 | 6/1965 | Lewis | 330/143 |
| 3,641,450 | 2/1972 | Lunn | 330/254 |
| 3,737,796 | 6/1973 | Legler | 330/285 |
| 3,870,964 | 3/1975 | Mills | 330/284 |
| 3,891,937 | 6/1975 | Bockelmann et al. | 330/254 |
| 3,908,172 | 9/1975 | Aschermann et al. | 330/284 |
| 4,051,441 | 9/1977 | Wheatley, Jr. | 330/288 |
| 4,101,841 | 7/1978 | Okada et al. | 330/254 |
| 4,105,942 | 8/1978 | Henry | 330/261 |
| 4,150,309 | 4/1979 | Tokuda | 330/250 |

OTHER PUBLICATIONS

"A Monolithic Analog Exponential Converter", by Johan H. Huiksing & J. Anne Van Steenwijk, IEEE Journal of Solid-State Circuits, vol. SC-15, No. 2, Apr. 1980.

"Differential Variable-Gain Amplifier", by C. C. Liu, IBM Technical Disclosure Bulletin, vol. 15, No. 5, Oct. 1972.

"A New Temperature Compensating Method for Logarithmic Amplifier", Katsuhiko Kawashima IEEE Trans. Nucl. Sci., vol. 17, No. 5, Oct. 1970.

*Primary Examiner*—James B. Mullins
*Assistant Examiner*—Gene Wan
*Attorney, Agent, or Firm*—James A. Scheer; James W. Gillman; Edward M. Roney

[57] ABSTRACT

An integratable amplifier circuit with logarithmic electronic gain control capability. The circuit is suitable for audio applications and permit logarithmic control of volume with an external potentiometer without need to send the audio signal through control lines. In addition, the temperature coefficient of the gain is maintained at a very low level over a wide gain range.

5 Claims, 2 Drawing Figures

LOW TEMPERATURE COEFFICIENT LOGARITHMIC ELECTRONIC GAIN CONTROLLED AMPLIFIER

BACKGROUND OF THE INVENTION

1. Field of the Invention

This invention relates generally to amplifier circuits with electronic gain control, and more particularly, to an amplifier susceptible to fabrication substantially in monolithic integrated circuit form in which logarithmic electronic gain control over a wide gain range may be effectively provided while maintaining temperature compensation independent of gain setting.

2. Description of the Prior Art

Sound amplification systems presently used often employ integrated circuits on a semiconductor chip with a resistor control potentiometer coupled to the IC circuitry for sound volume control. Since the human ear detects large changes in sound levels, it is desirable in some applications to provide a logarithmic gain control capable of varying the gain over a large range. In addition, for certain mobile communications applications it is desirable to utilize an electronic gain control so that the audio signal to be amplified does not pass through the control potentiometer. This avoids the need to send the audio signal through a control line thus eliminating the noise pick up which would otherwise occur. In the prior art, such logarithmic gain controlled amplifiers have a temperature dependence which increases with a decrease in gain that is unacceptable in many applications.

SUMMARY OF THE INVENTION

Accordingly, it is an object of this invention to provide an amplifier circuit with electronic logarithimic gain control which compensates the gain for temperature variations independent of gain setting.

It is still another object of this invention to provide an amplifier circuit of the foregoing type which is susceptible to fabrication in mostly monolithic integrated circuit form.

In practicing the invention, a low temperature coefficient logarithmic gain controlled amplifier is provided which includes an amplfier having a supply terminal and a gain which is proportional to the supply current of the amplifier through the first supply terminal. In addition, the gain controlled amplifier includes an impedance network, having a variable resistance, and first and second current sources, each having a current linearly dependent upon the temperature. A current control circuit is coupled to the first and the second current sources and the impedance network, and has an input coupled to the amplifier. The current control circuit controls the current through the amplifier in response to the currents of the first and second current sources and the impedance of the impedance network whereby the gain of the amplifier is maintained substantially temperature independent over a wide range of resistor network resistance values.

BRIEF DESCRIPTION OF THE DRAWINGS

The features of the present invention which are believed to be novel are set forth with particularity in the appended claims. The invention itself, together with further objects, features, and advantages thereof, may best be understood by reference to the following description when taken in conjunction with the accompanying drawings.

DETAILED DESCRIPTION OF THE PREFERRED EMBODIMENT

Figure 1:
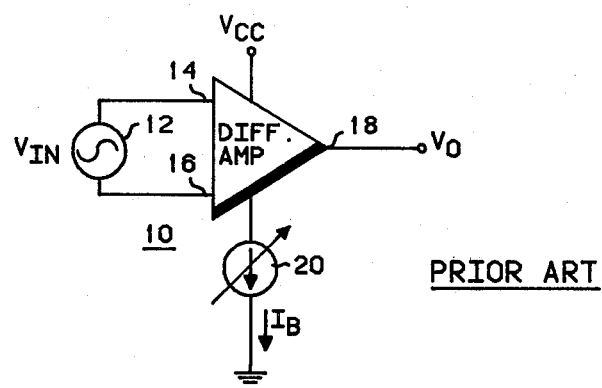
FIG. 1 is a diagram of a prior art gain controlled amplifier.

Referring to FIG. 1, there is shown a typical example of a prior art gain controlled amplifier 10. A signal $V_{IN}$ is applied by signal source 12 to the differential inputs 14, 16, resulting in an amplified output signal $V_O$ at an output 18. The gain of the gain controlled amplifier 10 is controlled by a current $I_B$ determined by a variable current source 20. Thus, an increase in the current $I_B$ results in an increase in gain. Similarly, by reducing the current $I_B$ to small values the gain is reduced to proportionately small values. A major problem with this prior art circuit is that the methods which have been used to reduce $I_B$ to small values cause an increase in the temperature dependence of the current $I_B$. This increase in temperature dependence of the current $I_B$ causes an increase in the temperature dependence of the gain.

Figure 2:
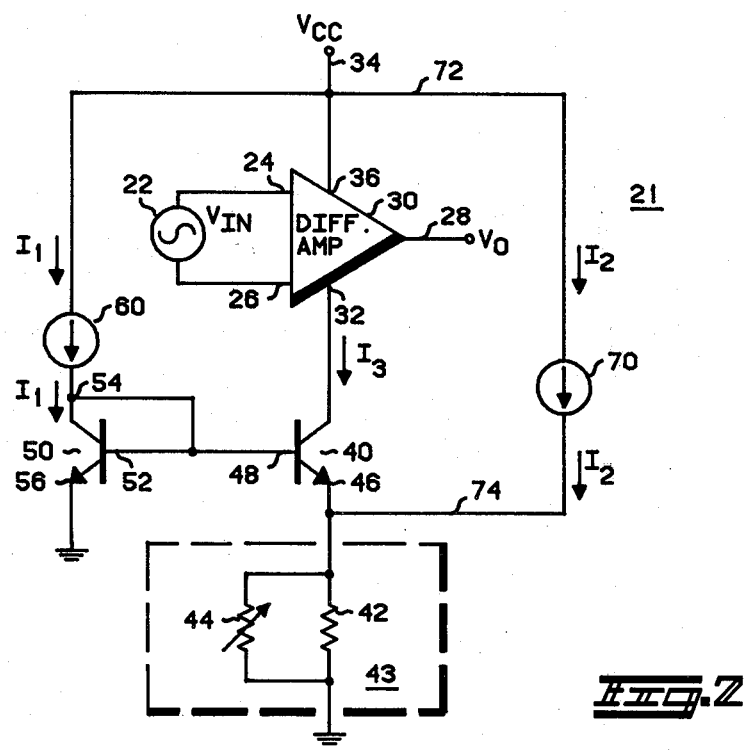
FIG. 2 is a schematic diagram of a preferred embodiment of the novel temperature compensated logarithmic, electronic gain controlled amplifier according to the invention.

Referring now to FIG. 2, there is shown a schematic diagram of a preferred embodiment of an electronically gain controlled amplifier 21 constructed in accordance with the invention. An input signal $V_{IN}$ generated by a signal source 22 is coupled to the differential inputs 24, 26 of a differential amplifier 30. This signal $V_{IN}$ is amplified by the differential amplifier 30 and the amplifier signal $V_O$ is applied to an output 28. The gain of the differential amplifier 30 is directly controlled by a biasing current $I_3$ flowing from the differential amplifier and down through a conductor 32. Thus, by varying the biasing current $I_3$ over several orders of magnitude, the gain can be varied over the same range. Audio amplifier circuits require this large gain variation because of the logarithmic level response of the human ear.

The biasing current $I_3$ is generated by a current source transistor 40 coupled to the conductor 32, as shown. The emitter 46 of the current source transistor 40 is coupled to an impedance network 43 (in this preferred embodiment, a resistor network) composed of a fixed value resistor 42 and a variable resistor 44 in parallel, as shown. In the preferred embodiment the fixed resistor 42 is intended to be integrated while the variable resistor is an external resistor such as a potentiometer. The base 48 of the current source transistor 40 is coupled to the base 52 of a current mirror transistor 50 with the base 52 shorted to the collector 54 in the conventional manner. The transistor 40 and the transistor 50 form a conventional current mirror. The emitter 56 is coupled to ground as shown while the collector is coupled to a current source 60 which generates a current $I_1$ proportional to absolute temperature. Current sources with such temperature dependence are known in the electronic circuit art. The current source 60 is also coupled to the supply 34. In addition, a current source 70 is coupled, as shown, from the supply 34 to the emitter 46 of the current source transistor 40. The current source 70 generates a current proportional to absolute temperature $I_2$ through the conductors 72, 74.

The biasing current $I_3$, and thereby the gain of the amplifier 30, can be controlled by varying the value of the resistance of the resistor network 43. For exmaple, an increase in the resistance of the resistor 44 will increase the effective resistance of the resistor network 43. This increase will result in an increase in the voltage across the resistor network 43 since the currents $I_2$ and $I_3$ flow through the resistor network 43 to ground. The increase in voltage across resistor network 43 will decrease the voltage across the base emitter junction of the transistor 40 since the base 48 of the transistor 40 is fixed by the base emitter voltage of the transistor 50. The base emitter voltage of the transistor 50 is maintained by the current $I_1$ generated by the current source 60. The decreased voltage will result in an exponential decrease in the current through the transistor 40 due to the exponential relationship between current and voltage for a bipolar transistor. Thus, a logarithmic gain control is provided.

The inverse temperature dependence of the gain of the differential amplifier 30 is cancelled by the effect of the current source 60 which generates the current $I_1$ which is dependent upon absolute temperature. Thus, any decrease in the gain of the differential amplifier 30 due to an increase in temperature will be offset by an increase in $I_3$ due to an increase in the base emitter voltage of the transistor 40 caused by an increase in the base emitter voltage of the transistor 50. The increase in the base emitter voltage of the transistor 50 results from an increase in the current $I_1$ caused by the temperature increase. The result is a cancelling of the effect on the gain of the differential amplifier 30 of the temperature increase by the temperature dependent current source 60.

The temperature dependence of the transistor 40 becomes most significant as the current $I_3$ becomes very small. This occurs when the resistor 44 is near maximum resistance and is the region in which the temperature dependence of the logarithmic gain controlled amplifier becomes most severe. This temperature dependence of the transistor 40 is cancelled by the effect of the current source 70 which generates the temperature dependent current $I_2$. The current $I_2$ generates a temperature dependent voltage across the resistor network which substantially cancels the temperature dependence of the transistor 40.

The only remaining temperature dependence is that of the internal resistance $R_S$ (not shown) of the current source 70, which is also significant primarily when the gain is reduced to a small value. This temperature dependence is substantially cancelled by the effect of the fixed resistor 42. In the preferred embodiment, the entire circuit of FIG. 2 is intended to be a single integrated circuit, with the exception of the variable resistor 44. Thus, the fixed resistance 42 is integrated, as is the current source resistance $R_S$, and therefore will have the same temperature dependence. When the gain is reduced such that $R_S$ becomes significant, the variable resistance 44 is so large that the effective resistance of the resistor network 43 is approximately equal to the resistance of the fixed resistor 42 and also has the temperature dependence of the fixed resistor 42. Since the resistor $R_S$ and the fixed resistor 42 have the same temperature dependence, the temperature effect is cancelled.

From the foregoing description it can be seen that an integratable amplifier has been described with logarithmic electronic gain control capability. Thus, the invention provides an integratable amplifier suitable for audio applications which permits logarithmic control of volume with an external potentiometer without the need to send the audio signal through a control line. In addition, the temperature coefficient of the gain is maintained at a very low level over a large gain range.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed herein.

What is claimed is:

1. A low temperature coefficient, logarithmic gain controlled amplifier circuit, comprising:
   (a) an amplifier having a supply terminal and having a gain which is proportional to the supply current of the amplifier through the supply terminal;
   (b) an impedance network having one end coupled to a reference level and having a variable resistance;
   (c) a first active current source, having a current linearly dependent upon temperature;
   (d) a second active current source, having a current linearly dependent upon temperature;
   (e) current control means coupled to the first current source, the second current source and the impedance network, and coupled to the amplifier, for controlling the supply current through the amplifier in response to the currents of the first and second current sources and the impedance of the impedance network whereby the gain of the amplifier is maintained substantially temperature independent over a wide range of impedance network impedance values.

2. The low temperature coefficient, logarithmic gain controlled amplifier of claim 1, wherein the current control means comprises a current mirror.

3. The low temperature coefficient, logarithmic gain controlled amplifier of claims 1 or 2 wherein the amplifier is a differential amplifier.

4. The low temperature coefficient, logarithmic gain controlled amplifier of claims 1 or 2, wherein the impedance network comprises a variable resistor in parallel with a fixed value resistor.

5. The low temperature coefficient, logarithmic gain controlled amplifier of claim 4, wherein all elements except the variable resistor are fabricated as a monolithic integrated circuit.

* * * * *